(12) United States Patent
Huang (10) Patent No.: US 10,057,051 B2
(45) Date of Patent: Aug. 21, 2018

(54) DUAL PATH TIMING WANDER REMOVAL

(71) Applicant: Silicon Laboratories Inc., Austin, TX (US)

(72) Inventor: Yunteng Huang, Palo Alto, CA (US)

(73) Assignee: Silicon Laboratories Inc., Austin, TX (US)

( * ) Notice: Subject to any disclaimer, the term of this patent is extended or adjusted under 35 U.S.C. 154(b) by 195 days.

(21) Appl. No.: 14/983,830

(22) Filed: Dec. 30, 2015

(65) Prior Publication Data

US 2016/0352506 A1 Dec. 1, 2016

Related U.S. Application Data

(63) Continuation-in-part of application No. 14/725,053, filed on May 29, 2015, now Pat. No. 9,705,668.

(51) Int. Cl.

| H04L 7/033 | (2006.01) |
|---|---|
| H04L 27/227 | (2006.01) |
| H04J 3/06 | (2006.01) |
| H03L 7/093 | (2006.01) |
| H03L 7/08 | (2006.01) |
| H03L 7/081 | (2006.01) |

(Continued)

(52) U.S. Cl.
CPC ............ *H04L 7/0332* (2013.01); *H03L 7/081* (2013.01); *H03L 7/0805* (2013.01); *H03L 7/085* (2013.01); *H03L 7/093* (2013.01); *H03L 7/0991* (2013.01); *H03L 7/0994* (2013.01); *H04J 3/0661* (2013.01); *H04L 27/2272* (2013.01)

(58) Field of Classification Search
CPC ... H04L 7/0332; H04L 27/2272; H03L 7/085; H03L 7/0994; H03L 7/081; H03L 7/0805; H03L 7/0991; H03L 7/093; H04J 3/0661
See application file for complete search history.

(56) References Cited

U.S. PATENT DOCUMENTS

| 4,151,485 A | 4/1979 | LaFratta |
|---|---|---|
| 5,563,891 A | 10/1996 | Wang |
| 5,986,485 A | 11/1999 | O'Sullivan |

(Continued)

OTHER PUBLICATIONS

Maneatis, J.G., "Low-Jitter Process-Independent DLL and PLL based on self-biased techniques," in IEEE Journal of Solid-State Circuits, vol. 31, No. 11, pp. 1723-1732, Nov. 1996.

(Continued)

*Primary Examiner* — Jackie Zuniga Abad
(74) *Attorney, Agent, or Firm* — Zagorin Cave LLP (57) ABSTRACT

A more cost effective wander jitter filter utilizes an excursion detector that receives a timing difference between a first signal and a second signal and supplies a first adjustment amount if a magnitude of the timing difference is above a predetermined threshold and otherwise supplies a second adjustment amount of zero. A summing circuit adjusts a magnitude of the timing difference by the first or second adjustment amount. A loop filter receives the summing circuit output and controls an oscillator. The excursion detector output (first adjustment value or zero according to the magnitude of the timing difference) is low pass filtered and the low pass filtered is reintroduced into the oscillator output or the feedback loop. The excursion detector output is accumulated and used to adjust a phase of the feedback signal from the oscillator.

20 Claims, 4 Drawing Sheets

(51) Int. Cl.
*H03L 7/085* (2006.01)
*H03L 7/099* (2006.01)

(56) References Cited

U.S. PATENT DOCUMENTS

| | | |
|---|---|---|
| 9,344,271 B1 | 5/2016 | Dusatko |
| 2005/0185747 A1 | 8/2005 | White |
| 2008/0191746 A1 | 8/2008 | Friedman et al. |
| 2009/0302906 A1 | 12/2009 | Rhee et al. |
| 2010/0045391 A1 | 2/2010 | Wang et al. |
| 2012/0236698 A1 | 9/2012 | Yoshida |
| 2012/0274311 A1* | 11/2012 | Antonesei .............. G01R 23/12 324/76.52 |
| 2015/0110233 A1 | 4/2015 | Azenkot et al. |
| 2016/0006544 A1 | 1/2016 | Cowley et al. |
| 2016/0352505 A1 | 12/2016 | Huang |

OTHER PUBLICATIONS

International Telecommunication Union, "Series G: Transmission Systems and Media, Digital Systems and Networks," ITU-T G.8261/Y.1361, Aug. 2013, 116 pages.
International Telecommunication Union, "Series G: Transmission Systems and Media, Digital Systems and Networks," ITU-T G.8263/Y.1363, Amendment 2, May 2014, 22 pages.
International Telecommunication Union, "Series G: Transmission Systems and Media, Digital Systems and Networks," ITU-T G.8265.1/Y.1365.1, Jul. 2014, 32 pages.

\* cited by examiner

DUAL PATH TIMING WANDER REMOVAL

CROSS REFERENCE TO RELATED APPLICATIONS

This application is a continuation-in-part of application Ser. No. 14/725,053 filed May 29, 2015, entitled "Dual Path Timing Jitter Removal", naming Yunteng Huang as inventor, which application is incorporated herein by reference in its entirety.

BACKGROUND

Field of the Invention

The invention relates to jitter and more particularly to dealing with jitter that contains large jitter due to packet delay variations relative to random jitter.

Description of the Related Art

Optical transport networks (OTNs), broadcast video, and other applications use timing signals as part of the system to transport payloads. Such timing signals include a signal component caused by random or thermal related jitter. Thus, timing signals for one part of the system are nominally, but not exactly the same as timing signals for another part of the system. Phase-locked loops (PLLs) have traditionally been used to deal with the random jitter. However, transport networks may also insert systematic jitter in timing signals by, e.g., inserting gaps in clocks to align input and output data. For example, assume data is being received at a network node at a rate of 1 Gb/s but is being transmitted from the node at a slower rate of 1% less than 1 Gb/s. One way to deal with that rate difference is to skip pulses or insert gaps into the timing signal (nominally 1 Gb/s) transmitted with the slower transmitted data. Thus, skipping clock pulses can be used to account for slightly different input and output data rates.

Use of gapped clocks is a convenient technique used in communication systems to pass timing and frequency information. The technique has the advantage of being a simple and universal interface where frequency/timing information is embedded within the clock signal. The drawback of using the gapped clock technique, however, is the jitter caused by the gaps for the downstream system. Since the gaps are inserted by OTN mappers/de-mappers, there is no noise shaping, nor any pattern control of these gap insertions. To reduce the clock jitter for downstream systems, very low bandwidth jitter cleaning devices (e.g. below 10 Hz) are typically used to filter out the jitter/wander caused by clock gaps. Since the gap patterns are very unpredictable and difficult to model and characterize, system performance cannot be guaranteed. That is one reason gapped clock techniques are not widely used despite the cleanness in system partitioning afforded by gapped clocks. Other drawbacks of gapped clock use is that low bandwidth jitter cleaning, which is sensitive to temperature fluctuations, has excessive system response latency. In addition, gapped clock use increases system cost due to the need for very low bandwidth jitter cleaning devices.

Large jitter can also be caused by wander in packet-based timing systems. Wander filtering is commonly needed in packet-based timings networks such as described in Recommendation ITU-T G.8265.1/Y.1365.1 ("Precision time protocol telecom profile for frequency synchronization"), Recommendation ITU-T G.8263/Y.1363 (2012—Amendment 2 ("Timing characteristics of packet-based equipment"); Recommendation ITU-T G.8261/Y.1361 ("Timing and synchronization aspects in packet networks"). Very low frequency wander filtering to address wander in packet-based timing networks is challenging and costly. Due to large packet delay variation (PDV), especially after more than 10 network hops, a very low loop bandwidth needs to be used to filter out jitter/wander. For example, a loop bandwidth of 1 mHz (where m is milli) may be used. Because of the long time constant associated with a 1 mHz loop bandwidth, the base frequency reference in the PLL needs to be ultra stable to meet the system specifications regardless of the PLL technology.

Figure 4:
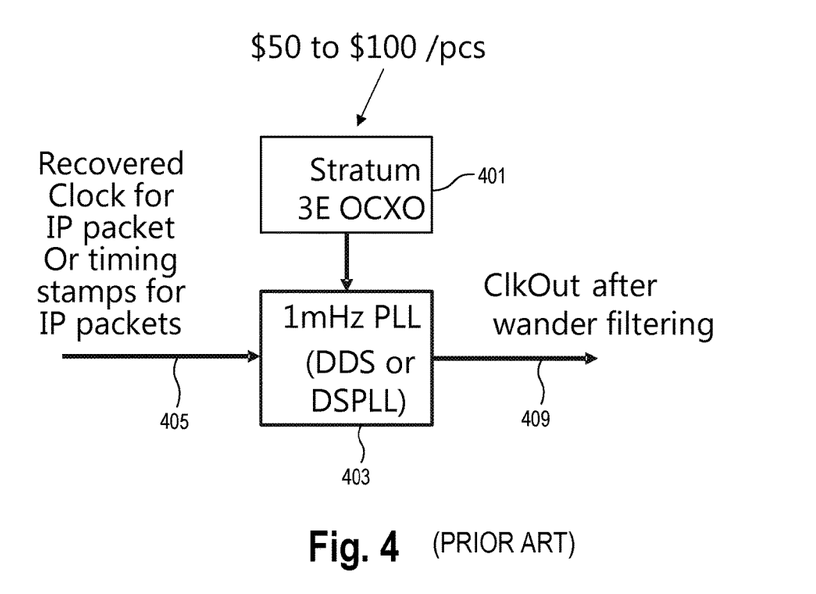
FIG. 4 illustrates a prior art implementation of a packet-based timing network.

Traditionally, as shown in FIG. 4, very low frequency wander filtering requires an ultra-stable local reference clock from an oven controlled crystal oscillator (OCXO) 401, which is supplied as a local reference to a very low bandwidth (e.g., 1 mHz) PLL 403 implemented using e.g., direct digital synthesis (DDS) or as a digital PLL. The very low bandwidth PLL 403 receives time stamps 405 associated with Internet Protocol (IP) packets and supplies a clock signal 409 after wander filtering. Such a solution can be expensive due the OCXO cost. For example, the costs of oven controlled crystal oscillators (OCXO) required to provide ultra stability, e.g., Stratum 2 or 3E OCXOs, dominate the synchronization costs of the system illustrated in FIG. 4 and may be in the range of $50-$100. In addition, it can take a long time, e.g., hours, for the low bandwidth PLL to respond.

Figure 5:
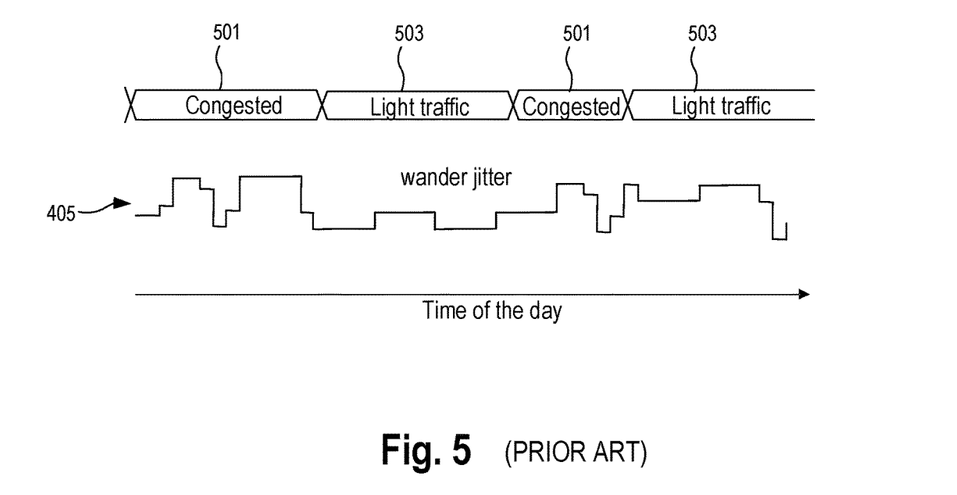
FIG. 5 illustrates that wander jitter may increase during congestion in a packet-based network.

Referring to FIG. 5, an exemplary timing diagram illustrates that packet delay may be present in the timing derived from time stamps 405 and can increase with network congestion 501 and decrease with lighter traffic 503. That is, during congestion a packet can take longer to reach its destination resulting in a greater difference between the time stamp associated with the transmitted packet and the arrival of the time stamp at its destination. Thus, as shown in FIG. 5 wander jitter may be higher during congestion. Note that random jitter is still present in the system.

SUMMARY OF EMBODIMENTS OF THE INVENTION

In an embodiment, a method includes determining a timing difference between a first signal and a second signal and supplying the timing difference. An excursion detector detects if a magnitude of the timing difference is above a predetermined timing threshold and supplies as an excursion detector output a first adjustment if a magnitude of the timing difference is above the predetermined threshold and otherwise supplies as the excursion detector output a second adjustment. An arithmetic circuit receives the excursion detector output and adjusts the timing difference by the first or the second adjustment. A loop filter receives an output of the arithmetic circuit. An oscillator is controlled based on the loop filter output and supplies an oscillator output signal. An output of the excursion detector is low pass filtered.

In another embodiment an apparatus includes an excursion detector that is coupled to receive a timing difference between a first signal and a second signal and supply as an excursion detector output a first adjustment if a magnitude of the timing difference is above a predetermined threshold and otherwise supply a second adjustment. An arithmetic circuit receives the excursion detector output and the timing difference. The arithmetic circuit adjusts a magnitude of the timing difference by the excursion detector output and supplies an arithmetic circuit output. A loop filter receives the arithmetic circuit output and supplies a loop filter output. An oscillator is coupled to be controlled based on the loop filter output and supplies an oscillator output signal. A low pass filter receives the excursion detector output and supplies a low pass filtered output of excursion detector output.

In another embodiment, a phase-locked loop (PLL) includes a time to digital converter circuit to generate a timing difference between a first signal based on a time stamp associated with a packet-based network and a second signal. An excursion detector receives the timing difference and supplies as an excursion detector output a first adjustment if a magnitude of the timing difference is above a predetermined threshold and otherwise supplies a second adjustment of zero. A low pass filter receives the excursion detector output and supplies a low pass filtered output of excursion detector output. An arithmetic circuit receives the excursion detector output and the timing difference and adjusts a magnitude of the timing difference by the excursion detector output and supplies an arithmetic circuit output. A loop filter receives the arithmetic circuit output and supplies a loop filter output. An oscillator is controlled based on the loop filter output and supplies an oscillator output signal. A phase adjust circuit adjusts the oscillator output signal based on the low pass filtered output and supplies a PLL output signal with reduced wander.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Instead of relying on a PLL to filter out the gap jitter caused by insertion of gaps in clock signals, embodiments described herein detect the gap, and once detected, filter out the gap digitally. Thermal jitter still goes through a traditional jitter cleaning phase-locked loop. As a result of handling the large jitter digitally, a low PLL bandwidth is no longer the only tool available to clean up jitter and the system jitter performance becomes more insensitive to gap patterns, leading to guaranteed jitter performance. The PLL bandwidth can be set on the order of kHz instead of single digit Hz typically used in traditional gap clock filtering solutions.

Figure 1:
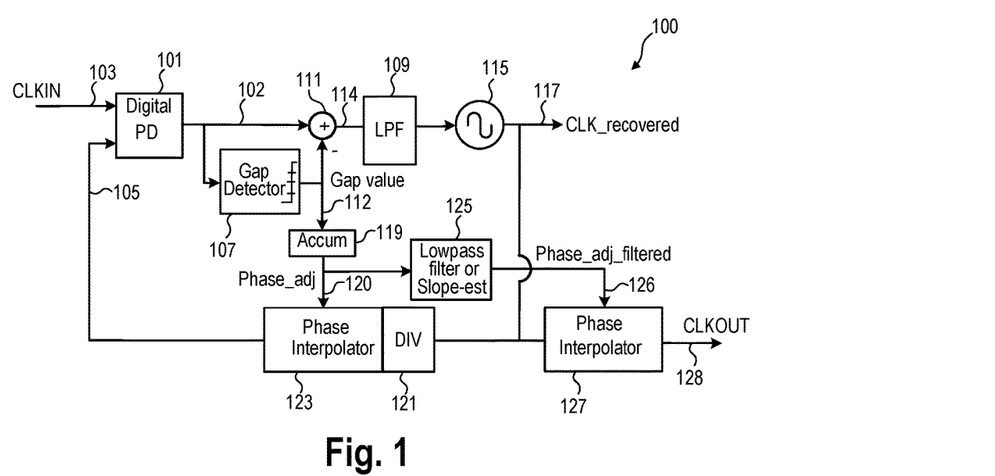
FIG. 1 illustrates an embodiment that separates thermal related jitter from systematic jitter and filters the different kinds of jitter separately.

Referring to FIG. 1, illustrated is an embodiment that separates thermal related jitter from more systematic jitter, and filters the different kinds of jitter separately, achieving better filtering. A digital phase detector (PD) 101 receives a clock signal (CLKIN) 103 and a feedback signal 105. The CLKIN signal 103 is a timing signal associated with data. In an embodiment, thermal jitter present in the CLKIN signal 103 goes through a traditional jitter cleaning phase-locked loop. The systematic jitter, e.g., caused by pulse skipping, once detected, is filtered out digitally as further described herein.

Figure 2A:
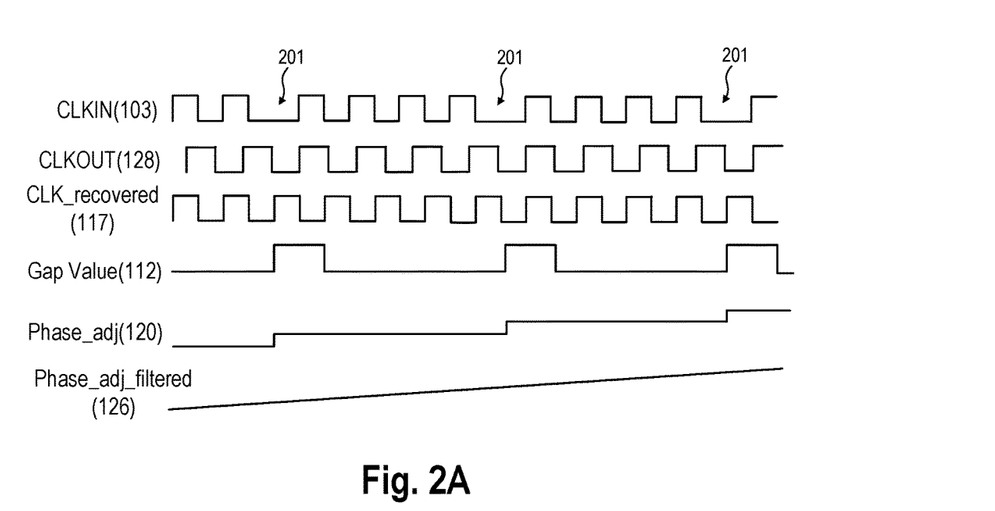
FIG. 2A illustrates a timing diagram associated with the embodiment of FIG. 1.

FIG. 2A illustrates an example timing diagram associated with the embodiment of FIG. 1. Assume that due to the need to align the clock with the data, CLKIN skips half a pulse every four cycles resulting in gaps 201. The ideal clock output, shown as CLKOUT, given the input clock CLKIN, is a clock with 9/10 the frequency of CLKIN with the clock pulses equally spread out.

Referring again to FIG. 1, the digital phase detector 101 detects the phase difference between the feedback signal 105 and the input clock (CLKIN) 103 and supplies a digital signal 102 corresponding to the difference. When a gap 201 occurs, the PD 101 generates the digital signal 102 with a value corresponding to the gap. Gap detector 107 detects when the output 102 of the phase detector 101 is above a predetermined threshold. For example, the threshold may be the digital equivalent of 0.75 ns. When the phase information provided on the phase detector output is less than the threshold, the phase difference is presumed to be thermal related jitter and the phase difference is supplied to the loop filter 109 unchanged.

However, if the gap detector detects a value greater than the threshold, the gap detector subtracts the gap value (e.g., 1 ns) from the phase difference information 102 in summer 111. The gap value corresponds to an estimate of the gap present in the system. Note that the threshold and the gap value are not the same. Instead, the threshold is smaller than the gap value. After subtraction, the remaining value can be zero, positive, or negative. The residual error remaining after the subtraction, which is assumed to be thermal jitter, is supplied to the loop filter 109.

Figure 2B:
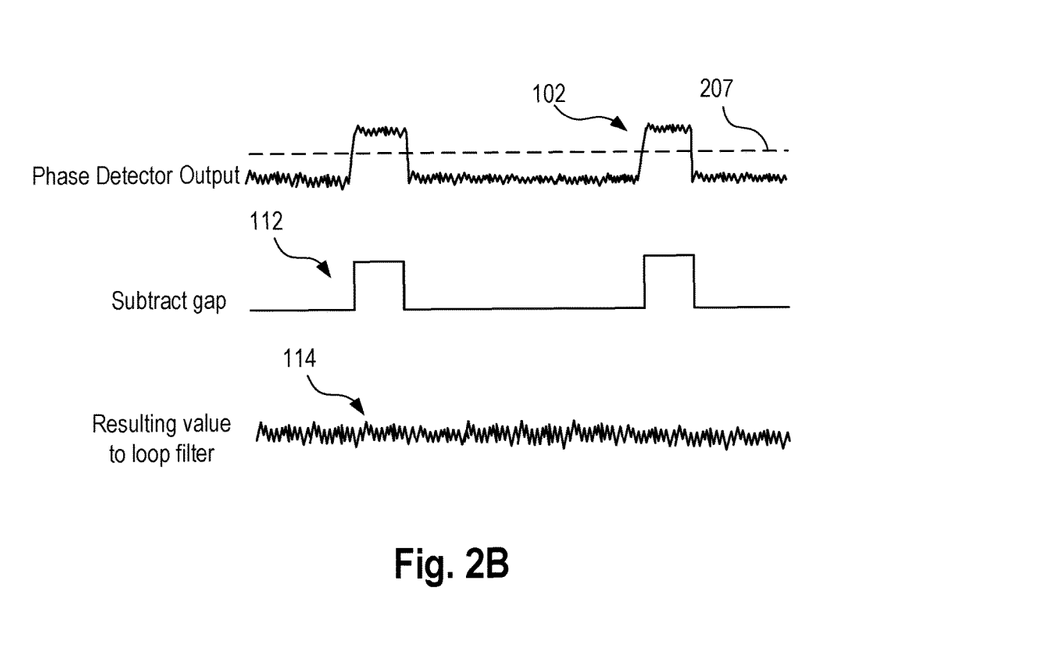
FIG. 2B illustrates operation of the gap detector and gap subtraction.

FIG. 2B illustrates operation of the gap detection and subtraction. The phase detector output 102 is compared to gap detector threshold 207. When the output of the phase detector is less than the threshold 207, the output 114 from the summer 111 supplied to the loop filter is assumed to be thermal jitter. However, when the output of the phase detector is more than the threshold 207, the gap 112 is subtracted from the phase detector output in summer 111 to cause the output 114 from the summer 111 to also appear as thermal jitter to be handled by the loop filter 109. A separate path handles the larger amplitude gap jitter.

Referring again to FIG. 1, the loop filter 109 controls the oscillator 115, which may be, e.g., a direct digital synthesis oscillator, a digitally controlled oscillator, or any suitable oscillator in accordance with system requirements and process constraints. The oscillator 115 supplies CLK_recovered 117. As shown in FIG. 2A, CLK_recovered is the original clock frequency before the gaps were inserted. The output 117 of the oscillator 115 is fed back through divider 121 and phase interpolator 123 to the digital phase detector 101.

FIGS. 1, 2A and 2B show the gap value 112 of the gap detector supplied by the gap detector 107. The gap detector 107 supplies an accumulator 119 with gap value 112, which keeps track of the accumulated gap difference. The accumulator 119 supplies the accumulated gap difference 120, also referred to herein as phase adjust signal, to the phase interpolator 123 to reintroduce the gap back into the PLL through the feedback path. The phase adjust signal 120 is shown in FIG. 2A as a series of steps, each step associated with a detected gap. The goal is to supply a CLKOUT signal reflecting the frequency of the input clock signal with no abrupt phase steps in the presence of input gaps and hence significantly reduced jitter. In order to maintain the same frequency between CLKOUT and feedback clock 105, the phase adjustment done by phase interpolator 123 is compensated by phase interpolator 127. The accumulator 119 supplies a low pass filter (or slope estimator) 125. The low pass filter is a very low frequency low pass filter, e.g., on the order of 1 to 100 Hz. That helps ensure that any abrupt changes in phase are reflected in the output signal slowly to reduce jitter impact. The low pass filter 125 generates the filtered phase adjust signal 126 shown in FIGS. 1 and 2A. The filtered phase adjust signal 126 reflects the phase difference between the CLK_recovered signal 117 and the CLKOUT signal 128. The low pass filter 125 supplies the filtered phase adjust signal 126 to a second phase interpolator 127 that slowly adjusts the CLK_recovered signal based on the linear ramp of the filtered phase adjust signal to obtain the CLKOUT signal.

Some embodiments may accommodate multiple levels of gaps. For example, some systems may have gap time durations nominally expected to be greater than 2 ns and other systems have gaps expected to be greater than 0.5 ns. Some systems may skip one pulse, other systems may skip multiple pulses at one time leading to a larger gap. In an embodiment the gap detector can be programmed to detect gaps of 20 ps, 40 ps, 80 ps, 160 ps, 320 ps, 640 ps, 1.2 ns, 2.4 ns, 4.8 ns, 9.6 ns, or $\frac{1}{512}$, $\frac{1}{256}$, $\frac{1}{128}$, $\frac{1}{64}$, $\frac{1}{32}$, $\frac{1}{16}$, $\frac{1}{8}$, $\frac{1}{4}$, $\frac{1}{2}$ or a whole period of the input clock. Such numbers are of course examples, and other embodiments may use additional or other gap values and gap detect thresholds suitable for the systems in which the embodiments may be utilized.

Thus, the gap detector may have a programmable gap detector that can be programmed by writing to memory associated with the gap detector. Both the gap value and/or the threshold value may be written to the memory.

In another embodiment, both the gap value and the threshold value may be estimated by the device. The gap value may be determined by estimating the step size in phase detector output 102 with proper averaging, and the gap detector threshold can be set as a percentage, e.g., 75% of the estimated gap value. In one embodiment to estimate the gap value, successive phase detector outputs are compared and when the difference between successive phase detector outputs is large, e.g., above a threshold difference value of 0.1 ns, a gap is presumed to be causing the large difference. Other threshold difference values may of course be utilized as appropriate. The value of the phase detector output corresponding to the large value is saved. That process is repeated until a suitable number of gap samples have been collected. That suitable number may be three or more according to the needs of the system. The samples are averaged to generate the gap value used in the embodiments of FIGS. 1 and 3. The threshold value may be set to a percentage, e.g., 50% or 75%, of the gap value.

Figure 3:
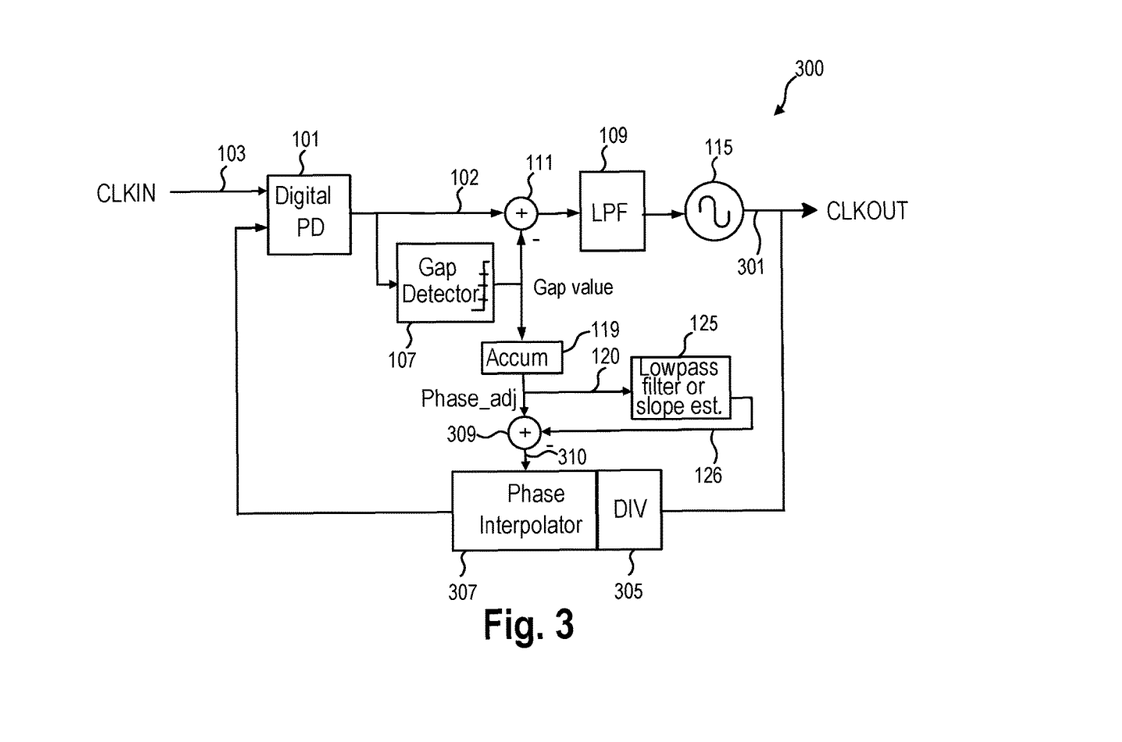
FIG. 3 illustrates an embodiment that separates thermal related jitter from systematic jitter and filters the different kinds of jitter separately and utilizes one phase interpolator.

While FIG. 1 illustrates one embodiment of a system utilizing a gap detector and two phase interpolators, FIG. 3 illustrates another embodiment in which a single phase interpolator is used. As can be seen in FIG. 3, the PLL 300 is similar to the PLL 100 of FIG. 1. The PLL 300 includes the digital phase detector 101, the gap detector 107, the summing circuit 111, the loop filter 109, the oscillator 115, and the accumulator 119. The CLKOUT signal 301 is supplied by the oscillator 115, rather than the phase interpolator 127 of FIG. 1. The feedback path feeds back CLKOUT 301 through the divider 305 and phase interpolator 307 to the digital phase detector 101. The accumulator 119 supplies the phase adjust signal 120 to the low pass filter or slope estimator 125. The slope estimator supplies the filtered phase adjust signal 126 to a summing circuit 309 that subtracts the filtered phase adjust signal 126 from the phase adjust signal and supplies the resulting signal 310 to the phase interpolator 307. The filtered phase adjust ramp 126 still represents the difference between CLKOUT and CLK_recovered. Thus, the linear phase ramp slowly adjusts the CLKOUT signal 301 to the frequency corresponding to the gapped clock so that it appears the same as the CLKOUT signal 128 (FIG. 1). One advantage of FIG. 3 is that only a single phase interpolator is required. Both of the embodiments of FIGS. 1 and 3 have the advantage that the systematic gap jitter is removed from the signal going into the loop filter hence the VCO is not corrupted by the systematic gap jitter. As a result, PLL bandwidth is not controlled by the need for gap removal and bandwidths (of PLLs 100 or 300) can be on the order of, e.g., 100 Hz~10 kHz, rather than the very low PLL bandwidth previously required.

Figure 6:
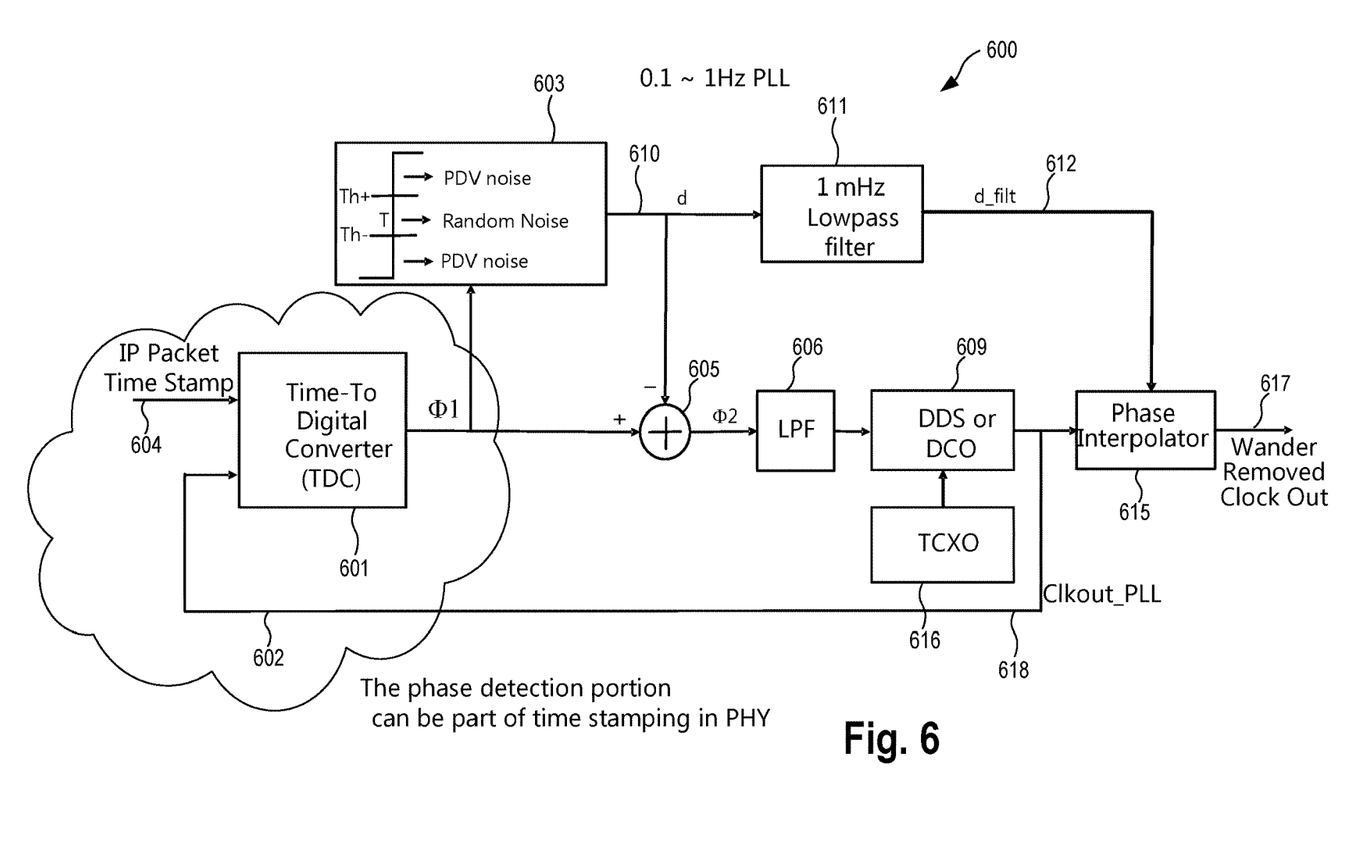
FIG. 6 illustrates an embodiment that separates timing differences due to packet delay variations and random timing variations and filters the different kinds of timing variations differently.

While systematic jitter may be introduced by gaps, as described above, large wander jitter may be introduced by packet delay in packet-based timing systems. FIG. 6 illustrates an embodiment to filter wander jitter using a dual path approach similar to the embodiments shown in FIGS. 1 and 3. Packet delay can be detected and compensated digitally and random jitter can be handled in a PLL having a larger bandwidth than used in the prior approaches.

FIG. 6 illustrates a PLL 600 for wander/jitter cleaning that includes a time to digital converter 601 that determines a difference between a feedback clock and a packet timing parameter and supplies the time difference between the two. The time to digital converter 601 may rely on time stamping that occurs in the physical layer (PHY) of the packet network. The packet timing parameter may be derived from various timestamps according to, for instance, Precision Time Protocol (PTP) (IEEE 1588). Timing information (e.g., a local timestamp) associated with the feedback clock 602 is compared to timing information 604 associated with the IP packet and a signal $\phi_1$ representing the time difference is supplied to an excursion detector 603 that compares the time difference supplied by TDC 601 to predetermined threshold levels. For example, the threshold levels are shown in FIG. 6 as Th+ and Th−. If the supplied time difference is between the threshold values Th+ and Th−, then the time difference is assumed to be due to random noise. In that case, the excursion detector supplies as an output adjustment "d" 610 with a value of zero. The output of the excursion detector is supplied to the summing circuit (more generically an arithmetic circuit) that adjusts the time difference $\phi_1$ by the time adjustment d. When d is zero, $\phi_1$ passes unchanged through summer 605 to low pass loop filter 606. That is, $\phi_2$ is the same as $\phi_1$.

If however, the time difference $\phi_1$ supplied by TDC 601 is more positive than the threshold value Th+ or more negative than the threshold value Th−, then the jitter is presumed to include a component caused by packet delay variation. In that case the detector 603 supplies the time adjustment "d" 610 with a non zero predetermined value to reduce the time difference $\phi_1$ by the nonzero predetermined value to thereby remove large jitter due to packet delay. The nonzero adjustment value is typically larger than the magnitude of the threshold. Note that the non zero adjustment value may be programmable. Summing circuit 605 reduces the magnitude of $\phi_1$ using the nonzero adjustment "d" leaving the residual error $\phi_2$ smaller in magnitude than $\phi_1$. The residual error $\phi_2$ now corresponds more closely to random jitter to be processed by the loop filter 606 and the PLL in a traditional manner. The larger jitter caused by packet delay variations is processed in a separate path. The digital output "d" is an integer value representing the quantized $\phi_1$ value in "T" units such that the residual value $\phi_2$ is within the random noise threshold Th+ and Th−. The loop filter 606 controls an oscillator circuit 609 that may be implemented, e.g., as a direct digital synthesis (DDS) circuit or digitally controlled oscillator (DCO) or other appropriate oscillator. The oscillator 609 receives a reference clock signal from a temperature controlled crystal oscillator (TCXO) 616 that has much less stringent stability requirements than the timing network implementation of FIG. 4 because the loop bandwidth can be significantly larger, e.g., on the order of approximately 0.1 Hz to approximately 1 Hz as compared to 1 mHz, where approximately means within 10% of the nominal value. The larger loop bandwidth results in a lower cost system.

The adjustment d having either the predetermined non-zero value or zero, is supplied to a very low bandwidth (e.g. 1 mHz) digital low pass filter 611 that supplies a filtered value d_filt 612 to a phase interpolator 615. The 1 mHz digital low pass filter 611 does not require an additional accurate time base and compensates and filters out the large phase jumps. The phase interpolator 615 adjusts an output of the oscillator 609 in accordance with the filtered value d_filt 612 to supply a clock output signal 617 with wander removed. The phase interpolator 615 very slowly reintroduces into the output signal 617 the jitter removed by summing circuit 605.

Unlike the gap clock PLL embodiments shown in FIGS. 1 and 3, where there is a frequency offset between the input clock (when gaps are absent) and output clock, the wander removal PLL 600 does not have a frequency difference between the input and output, i.e., the long term accumulated value of "d" is zero in the wander PLL embodiment of FIG. 6 as compared to being non-zero in the gap clock PLL embodiments of FIGS. 1 and 3. Therefore, the accumulator 119 and the phase interpolator 123 (see FIG. 1) are not needed in the embodiment of FIG. 6.

By detecting timing excursions above a certain threshold, packet delay variation caused timing jitter can be separated from the random noise jitter and processed separately. After removing the large phase jumps caused by packet delay variations by subtracting the time adjustment d, the random noise jitter can be sufficiently filtered out with a much wider bandwidth PLL (e.g., on the order of 0.1 Hz or 1 Hz). By using a 1 Hz PLL, a much more relaxed TCXO can be used resulting in significant cost savings. For example, the TCXO of the embodiment of FIG. 6 may cost in the $5 to $20 range, significantly lower than the OCXO of FIG. 4. The overall system of FIG. 6 can behave as well as a system such as shown in FIG. 4 with the more stringent stability requirements for the OCXO.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A method comprising:
   determining a timing difference between a first signal and a second signal and supplying the timing difference;
   detecting in an excursion detector if a magnitude of the timing difference is above a predetermined timing threshold and supplying as an excursion detector output a first adjustment if the magnitude of the timing difference is above the predetermined timing threshold and supplying as the excursion detector output a second adjustment if the magnitude of the timing difference is below the predetermined timing threshold;
   supplying the excursion detector output to an arithmetic circuit and adjusting the timing difference by the first or the second adjustment;
   supplying a loop filter with an output of the arithmetic circuit and generating a loop filter output;
   controlling an oscillator based on the loop filter output and supplying an oscillator output signal; and
   low pass filtering the output of the excursion detector and supplying a low pass filtered output.

2. The method as recited in claim 1, further comprising:
   the arithmetic circuit reducing the magnitude of the timing difference when the excursion detector supplies the first adjustment and passing the timing difference unchanged when the excursion detector supplies the second adjustment.

3. The method as recited in claim 1 further comprising adjusting the oscillator output signal based on the low pass filtered output and supplying an adjusted oscillator output signal as an output signal.

4. The method as recited in claim 1 wherein the first signal corresponds to a time stamp associated with a packet-based network and the second signal corresponds to a feedback signal from the oscillator.

5. The method as recited in claim 1 wherein the timing difference above the predetermined timing threshold is caused by a gapped clock.

6. The method as recited in claim 1 wherein at least one of the predetermined timing threshold and the first adjustment is a programmable value.

7. The method as recited in claim 1 further comprising determining the timing difference using a feedback signal based on the oscillator output signal.

8. The method as recited in claim 1 wherein the second signal corresponds to a feedback signal from the oscillator.

9. The method as recited in claim 1 wherein the second signal corresponds to a time stamp associated with a feedback signal based on the oscillator output signal.

10. An apparatus comprising:
    an excursion detector coupled to receive a timing difference between a first signal and a second signal and supply as an excursion detector output a first adjustment if a magnitude of the timing difference is above a predetermined threshold and to supply a second adjustment if the magnitude of the timing difference is below the predetermined threshold;
    an arithmetic circuit coupled to receive the excursion detector output and the timing difference and adjust the magnitude of the timing difference by the excursion detector output and supply an arithmetic circuit output;
    a loop filter coupled to receive the arithmetic circuit output and supply a loop filter output;
    an oscillator coupled to be controlled based on the loop filter output and supply an oscillator output signal; and
    a low pass filter coupled to receive the excursion detector output, to low pass filter the excursion detector output, and to supply a low pass filtered output.

11. The apparatus as recited in claim 10 wherein the first adjustment causes the arithmetic circuit to reduce the magnitude of the timing difference and the second adjustment is zero thereby causing the arithmetic circuit to pass the timing difference unchanged.

12. The apparatus as recited in claim 10 comprising:
a phase adjust circuit to adjust the oscillator output signal based on the low pass filtered output and supply an adjusted output signal.

13. The apparatus as recited in claim 10 comprising:
a time to digital converter circuit to generate the timing difference between the first and second signals.

14. The apparatus as recited in claim 13 wherein the first signal corresponds to a time stamp associated with a packet-based network.

15. The apparatus as recited in claim 14 wherein the second signal corresponds to a feedback signal from the oscillator.

16. The apparatus as recited in claim 15 wherein the second signal corresponds to a time stamp associated with the feedback signal from the oscillator.

17. The apparatus as recited in claim 10 further comprising a phase-locked loop including a time-to-digital converter, the loop filter, and the oscillator, and a loop bandwidth of the phase-locked loop is between approximately 0.1 Hz and approximately 1 Hz.

18. The apparatus as recited in claim 10 wherein the low pass filter has a bandwidth of approximately 1 mHZ.

19. The apparatus as recited in claim 10 further comprising a temperature controlled crystal oscillator coupled to supply a reference signal for use by the oscillator.

20. A phase-locked loop (PLL) comprising:
a time to digital converter circuit to generate a timing difference between a first signal based on a time stamp associated with a packet-based network and a second signal;
an excursion detector coupled to receive the timing difference and supply as an excursion detector output a first adjustment if a magnitude of the timing difference is above a predetermined threshold and supply a second adjustment of zero if the magnitude of the timing difference is below the predetermined threshold;
a low pass filter coupled to receive the excursion detector output, to low pass filter the excursion detector output, and to supply a low pass filtered output;
an arithmetic circuit coupled to receive the excursion detector output and the timing difference and adjust the magnitude of the timing difference by the excursion detector output and supply an arithmetic circuit output;
a loop filter coupled to receive the arithmetic circuit output and supply a loop filter output;
an oscillator coupled to be controlled based on the loop filter output and supply an oscillator output signal; and
a phase adjust circuit to adjust the oscillator output signal based on the low pass filtered output and supply a PLL output signal.

* * * * *